United States Patent
Schnell

(10) Patent No.: US 7,209,396 B2
(45) Date of Patent: Apr. 24, 2007

(54) DATA STROBE SYNCHRONIZATION FOR DRAM DEVICES

(75) Inventor: Josef Schnell, Charlotte, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/068,582

(22) Filed: Feb. 28, 2005

(65) Prior Publication Data
US 2006/0193194 A1    Aug. 31, 2006

(51) Int. Cl.
*G11C 7/00*    (2006.01)
(52) U.S. Cl. ........................ 365/193; 365/191
(58) Field of Classification Search ........... 365/191, 365/193
See application file for complete search history.

(56) References Cited

U.S. PATENT DOCUMENTS 6,329,854 B1 * 12/2001 Lee et al. ............... 327/158

2003/0086303 A1 * 5/2003 Jeong ................. 365/189.05
2004/0222828 A1 * 11/2004 Ishikawa ............... 327/156

FOREIGN PATENT DOCUMENTS

| KR | 1020000018490 | 4/2000 |
|---|---|---|
| KR | 1020030037588 | 5/2003 |

OTHER PUBLICATIONS

KIPO Examination Report dated Dec. 15, 2006.

* cited by examiner

*Primary Examiner*—Kretelia Graham
(74) *Attorney, Agent, or Firm*—Patterson & Sheridan, L.L.P.

(57) ABSTRACT

Methods and apparatus that determine, at a device (e.g., a DRAM device), a phase difference between two externally supplied timing signals such as a clock signal (CLK) and a data strobe signal (DQS) are provided. Adjustments may be made to timing of one of the signals itself or other internal memory signals that are, perhaps, utilized in circuits controlled by the DQS signal.

14 Claims, 5 Drawing Sheets

DATA STROBE SYNCHRONIZATION FOR DRAM DEVICES

BACKGROUND OF THE INVENTION

1. Field of the Invention

The invention generally relates to memory devices and, more particularly, to detecting the phase difference between a clock signal and a data strobe signal.

2. Description of the Related Art

In many memory designs there is often more than one timing signal and generally these timing signals may be skewed. In general, skew refers to the difference in timing between two timing signals, e.g., the time from the leading edge of the first timing signal to the leading edge of the second timing signal. In some designs, one timing signal may be allowed to be skewed to another by a predetermined allowance. For example, in current double data rate DDR dynamic random access memory (DRAM) designs, the phase relationship of a data strobe signal (DQS) and a clock signal (CLK) may be skewed by up to +/−25%. In some memory designs, certain logic within the memory may be timed to the CLK signal, or within the CLK domain, while other logic within the memory may be timed to the DQS signal, or within the DQS domain.

In conventional DRAM designs, internal synchronization was done by adjusting the internal timings to accommodate the worst-case DQS–CLK skew condition. An example of this approach is shown in FIG. 1. Three potential DQS signals are shown, DQS @ tDQSSnom, DQS @ tDQSSmin and DQS @ tDQSSmax, representing the nominal DQS timing and the two worst-case DQS timings, when DQS leads CLK by 25% and when DQS lags CLK by 25%. The memory's internal timing must be able to operate over this entire range of CLK/DQS timing, which is becoming more difficult as clock speed increase. In this example, the timing of the DQS signal may be closely synchronized with CLK (DQS @ tDQSSnom) or may lead the CLK by up to 25% (DQS @ tDQSSmin) or may lag the CLK by up to 25% (DQS @ tDQSSmax), providing a CLK–DQS skew range as indicated.

In conventional DRAM designs, internal timing had to be set to compensate for this wide range of timing differences, having to operate over a range of from −25% to +25%. The prior designs had to assume a worst-case phase difference and deal with that difference, perhaps by having tighter internal timings. As memory clock speeds increase, it becomes more difficult to compensate for these timing differences and internal signals derived from these clock and data strobe signals may need to be closer aligned to the clock to prevent errors from occurring. Rather than accommodate the worst case timing, it would be beneficial to adjust internal timing signals based on the actual phase difference between the DQS and CLK signals. However, in conventional designs, no attempt has been made to detect this phase difference.

Therefore, what is needed are methods and apparatus for detecting, at a memory device, the phase difference between a clock signal (CLK) and a data strobe signal (DQS) and using this detected difference to adjust signal timing.

SUMMARY OF THE INVENTION

The present invention generally provides methods and apparatus for detecting the skew difference between two signals and providing for the insertion a variable amount of delay into a third signal depending upon the skew difference.

One embodiment provides a method for adjusting the timing of an internal signal within an integrated circuit. The method generally includes determining a phase difference between first and second externally supplied timing signals, generating a multi-bit control signal based upon the determined phase difference, and adjusting the timing of the internal signal based upon the multi-bit control signal.

Another embodiment provides a method for adjusting the timing of one or more signals used by a memory device. The method generally includes determining a phase difference between an externally supplied clock signal (CLK) and an externally supplied data strobe signal (DQS), generating a multi-bit control signal based upon the determined phase difference, and adjusting the timing of the one or more signals based upon the multi-bit control signal.

Another embodiment provides an apparatus for adjusting internal timing of an integrated circuit based on first and second externally supplied timing signals. The apparatus generally includes at least one phase detection circuit configured to detect a difference in phase between the first and second externally supplied timing signals and generate at least one delay control signal indicative of the detected phase difference and an adjustable delay circuit configured to adjust the timing of an internal timing signal based on the delay control signal.

Another embodiment provides a memory device generally including one or more memory elements and at least one phase detection circuit. The phase detection circuit is configured to detect a difference in phase between a clock signal (CLK) and a data strobe signal (DQS) used during write accesses to the one or more memory elements and to generate a multi-bit control signal indicating the detected phase difference.

Another embodiment provides a memory device generally including one or more memory elements, at least one phase detection circuit and at least one adjustable delay circuit. The phase detection circuit is generally configured to detect a difference in phase between a clock signal (CLK) and a data strobe signal (DQS) used during write accesses to the one or more memory elements and to generate a multi-bit control signal indicating the detected phase difference. The adjustable delay circuit is generally configured to adjust the timing of at least one internal timing signals based on the multi-bit control signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention generally determine, at a device (e.g., a DRAM device), a phase difference between two signals such as a clock signal (CLK) and a data strobe signal (DQS), and adjusts some parameters of timing based on the measured difference. In some embodiments, the adjustment is made to the data strobe signal itself (DQS). In other embodiments, the adjustment is made to other internal memory signals that are, perhaps, utilized in circuits controlled by the DQS signal (e.g., these signals are within the DQS domain).

To facilitate understanding, embodiments of the present invention will be described with reference to memory devices, specifically DRAM devices, as specific, but not limiting application examples. However, those skilled in the art will recognize that the same principles described herein may be applied to adjust the timing of various control signals in various other types of integrated circuits, based on a detected phase difference between various types of other timing signals.

Figure 1:
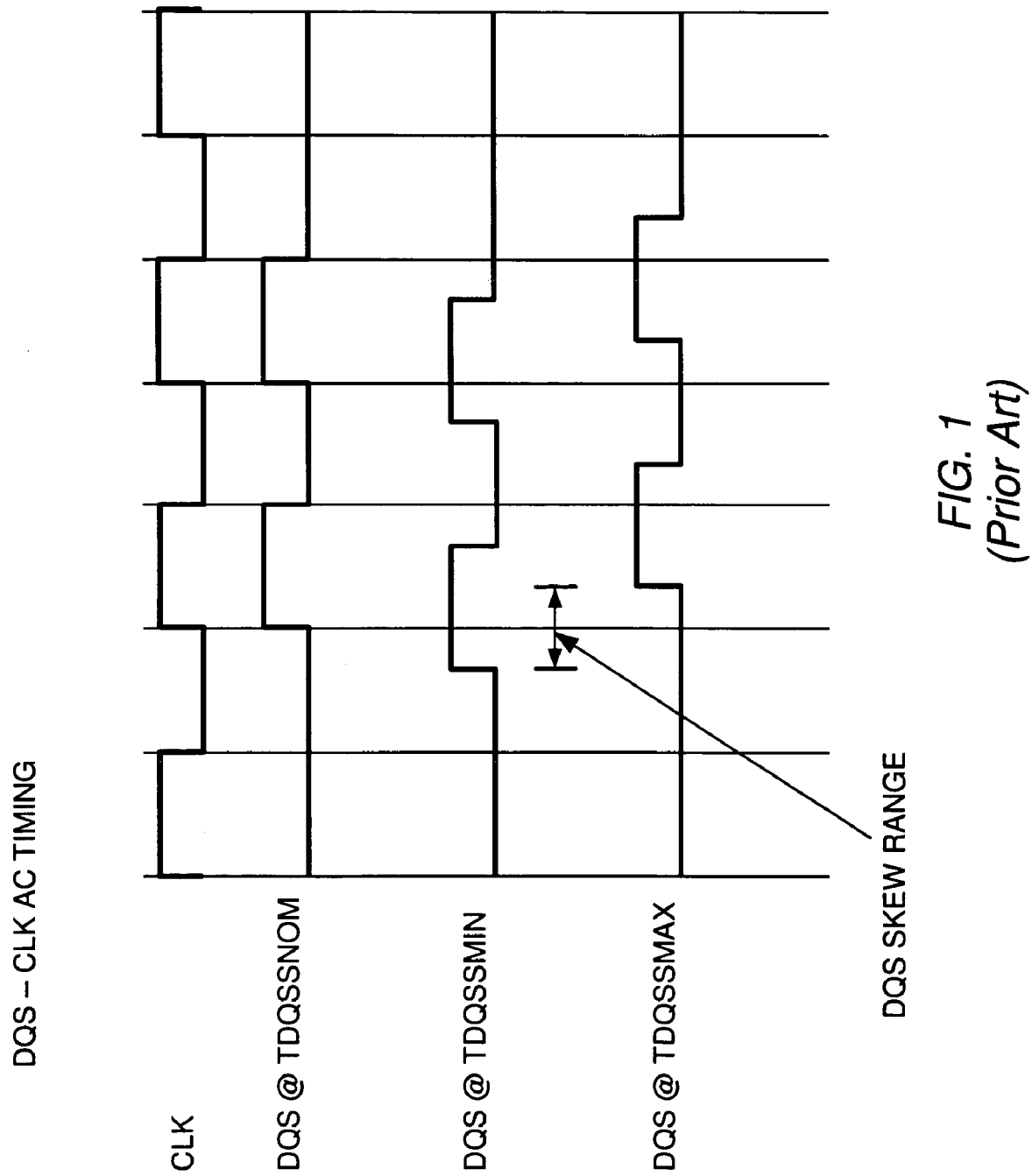
FIG. 1 is a timing diagram showing the timing approach of the prior art.
Figure 2:
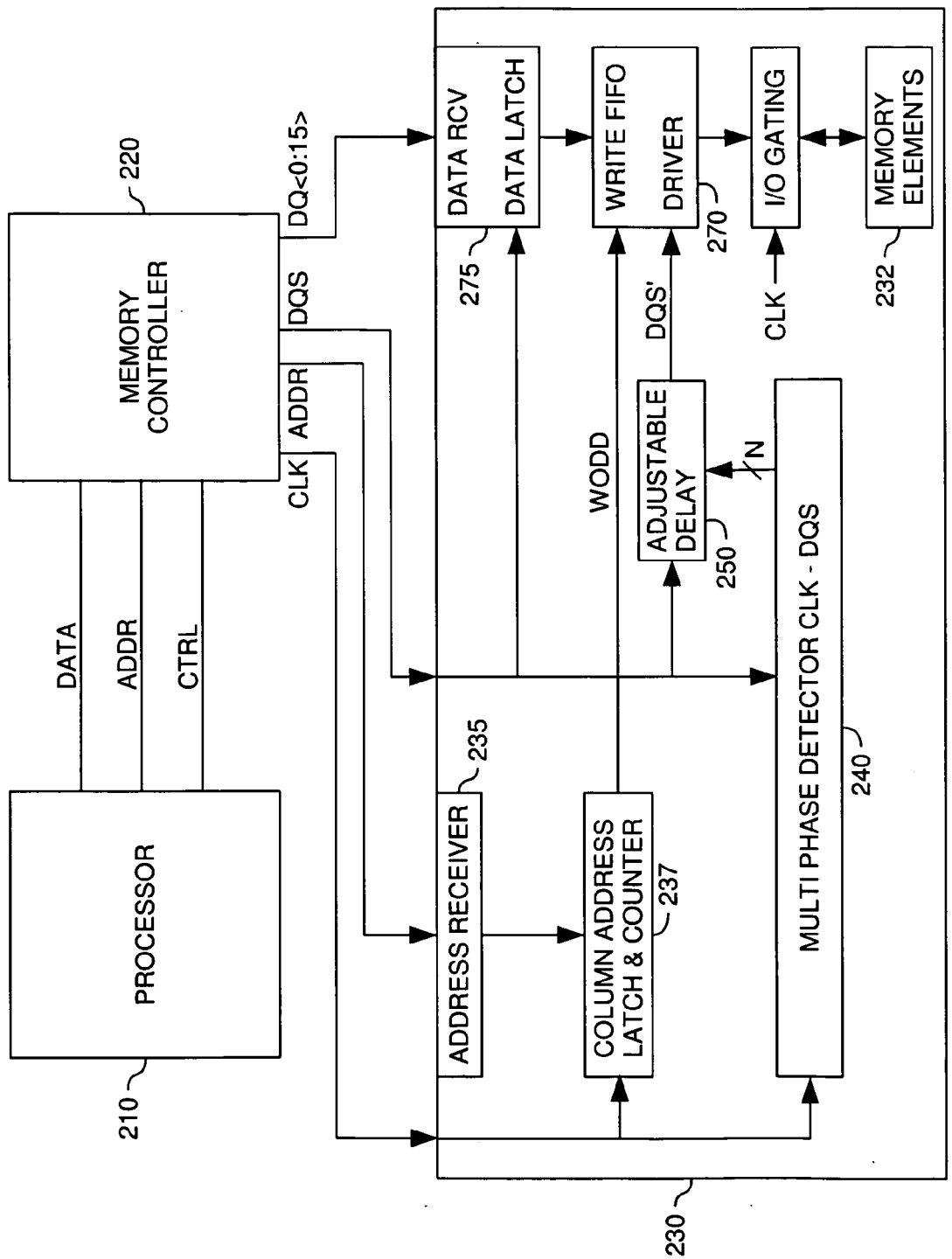
FIG. 2 is a schematic diagram of a system including an exemplary memory device in accordance with one embodiment of the present invention.

FIG. 2 shows a system according to the present invention where the phase difference CLK and DQS signals is detected within a memory (e.g., a DRAM) device 230. This figure shows a partial schematic of a computer system, showing those components that relate to the present invention and not showing other components such as drives, monitors and networking so as to focus on the present invention. In this embodiment, a processor 210 is coupled to a memory controller 220 through various means known in the industry. In this example, a data bus, address bus and control bus connect the processor 210 to the memory controller 220.

In this example, the memory device 230 is connected to and controlled by the memory controller 220. Two timing signals (CLK and DQS), an address bus (ADDR), and data bus (DQ) are shown emanating from the memory controller 220 and terminating at the memory 230. The memory controller supplies the CLK and DQS signals to the memory device 230 when performing write operations to write data to memory elements 232. For brevity purposes, other signals going between the memory 230 and the memory controller 220 are not shown, such as control signals.

In the illustrated embodiment, the timing relationship (phase difference) between CLK and DQS is detected by a multi-phase detector 240 within memory 230. This phase detector may comprise multiple discrete phase detectors and may output multiple signals indicating which signal leads and the absolute value of the detected phase difference. In this example, n outputs are generated by the multi-phase detector 240 and these n outputs are used to control an adjustable delay circuit 250. The adjustable delay circuit 250 takes as input the phase difference from the phase detector 240 and the DQS signal and inserts/removes adjustable delay amounts to create an adjusted internal DQS signal (DQS') which is then used within the memory 230 to control the timing of various circuits.

For example, DQS' may be used to strobe a DATA first-in first-out (FIFO) and driver logic 270 during write operations. Further, as illustrated, DQS' may be used to latch a word order address (WODD) on a falling edge of DQS' that is used to order (even/odd) data received (in data receive and latch logic 275 on rising and falling edges of the DQS clock signal) within the DATA FIFO logic 270. WODD may be latched with column address latch and counter logic 237 (that receives an address from an address receiver 235) in conjunction with CLK. DQS' may also be used to synchronize data path logic within the DATA FIFO and Driver logic 270 to drive the data received on both rising and falling edges after a serial to parallel conversion. The column address latch and counter 237 may supply the latched addresses (WODD) to DATA FIFO and Driver logic 270. In any case, because the internal DQS' is more closely matched in phase with the CLK signal, internal timing margins in these address and data paths may be improved.

Figure 3:
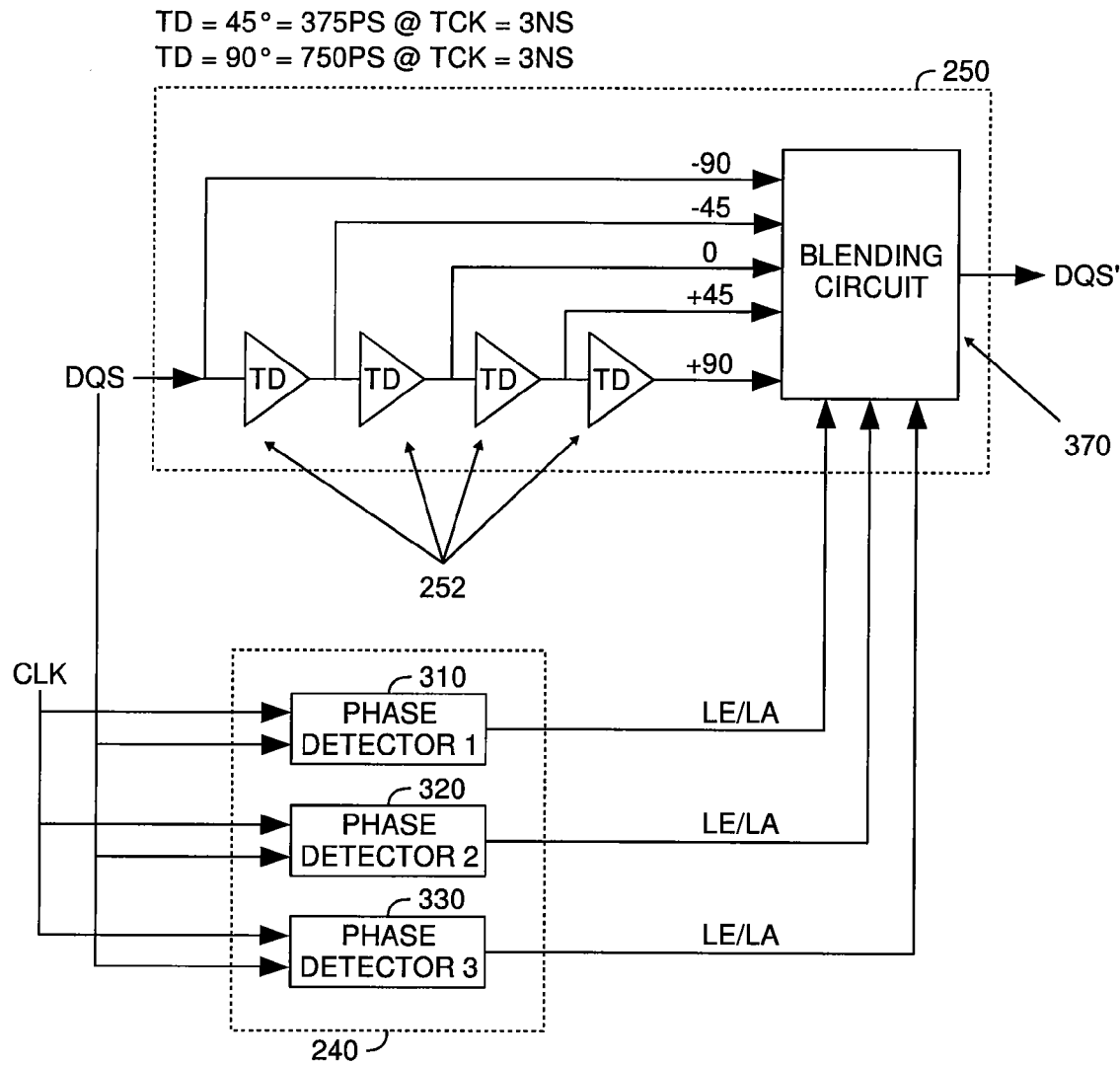
FIG. 3 is a schematic diagram of a multi-phase detector and adjustable delay circuit in accordance with one embodiment of the present invention.

The adjustable delay circuit 250 may include any suitable circuitry to adjust the phase of the externally supplied DQS to generate the adjusted internal DQS signal DQS' based on the phase difference signals provided by the multi-phase detector 240. For example, as illustrated in FIG. 3, the adjustable delay circuit 250, including a multi-tap array of delay elements 252, that feed a plurality of delayed versions of DQS evenly spaced in phase (e.g., every ⅛ clock cycle or 45°) into a phase blender circuit 370. The phase blender circuit 370 blends one or more of the delayed signals, based on the signals provided by the multi-phase detector 240, to generate the adjusted internal DQS signal DQS'. In other words, the blender circuit 370 allows for finer delay increments than the delay elements 252.

As illustrated, the multi-phase detector 240 may include three individual phase detectors: phase detector 1 310, phase detector 2 320, and phase detector 3 330. As described above, the output of each phase detector (310, 320 and 330) is used by the phase blender 370 to select in the delayed signals to blend to generate DQS'. The phase detectors 310–330 may be designed to detect and generate different output signals (e.g., LE/LA signals illustrated in FIG. 3) based on different magnitudes of phase delay between DQS and CLK. The operating range of the phase detector and compensation in the adjustable delay circuit may be expressed in terms of the maximum DQS–CLK timing offset, for example, with a tDQSSmin/max of 0.25*tCK (e.g., 90° out of phase) at high operation frequency (tCK>~3 ns). At lower operation frequency the internal timing may not be as critical and the timing adjustment may be limited to the maximum adjustable delay.

For example, phase detector 1 310 may generate a high output (e.g., logic 1) if DQS leads CLK by more than 45° and a low output (e.g., logic 0) otherwise. Phase detector 2 320 may generate a low output if DQS leads CLK at all (e.g., by more than 0°) and a high output otherwise, while phase detector 3 330 may generate a high output if DQS lags CLK by more than 45° and a low output otherwise. Thus, the output signals from these phase detectors may be used to indicate the phase relationship between DQS and CLK by various ranges. For example, TABLE I below shows how the combined outputs of the individual phase detectors (labeled Ø1, Ø2, and Ø3) may be interpreted.

TABLE I

| Phase ranges indicated by multi-phase detector. | | | |
|---|---|---|---|
| PHASE RELATIONSHIP | Ø1 | Ø2 | Ø3 |
| DQS leads CLK by 45° or more | 0 | 0 | 0 |
| DQS leads CLK by 0°–45° | 1 | 0 | 0 |
| DQS lags CLK by 0°–45° | 1 | 1 | 0 |
| DQS leads CLK by 45° or more | 1 | 1 | 1 |

The blending circuit 370 may then use these signals to select the delayed signals to blend in order to generate DQS'.

For example, if the signals indicate DQS leads CLK by 45° or more, the blending circuit 370 may select delayed signals that result in DQS' having significant delay relative to DQS. On the other hand, if the signals indicate DQS lags CLK by 45° or more, the blending circuit 370 may pass DQS through with minimal or no additional delay. Those skilled in the art will recognize that any number of phase detectors may be utilized to detect different ranges of phase differences between CLK and DQS.

Figure 4:
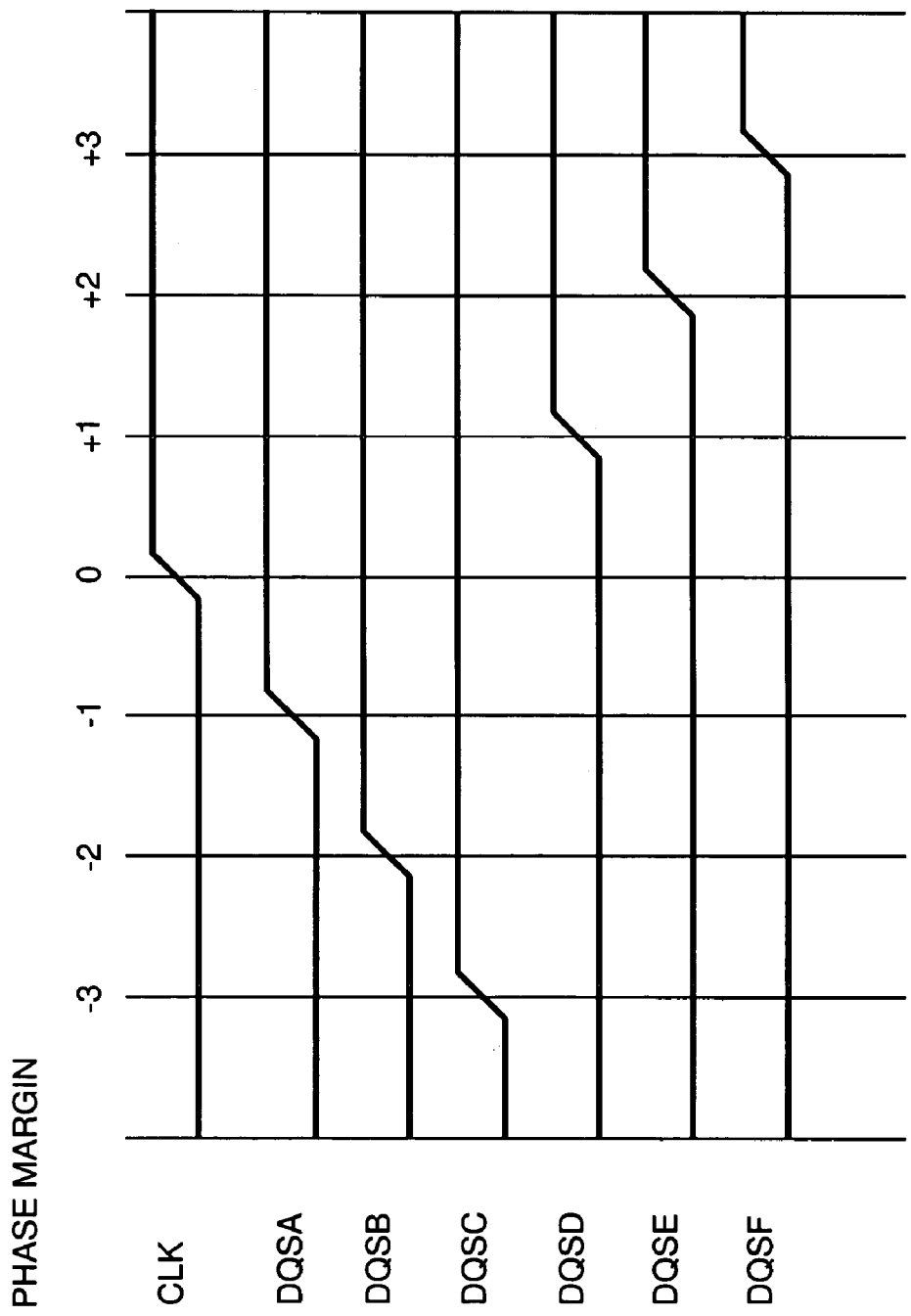
FIG. 4 is a timing diagram illustrating phase differences that may be detected in accordance with one embodiment of the present invention.

For example, FIG. 4 shows six different phase differences between CLK and DQS that could be detected using six phase detectors (with DQS signals DQSa–f leading/lagging by up to three unit delay periods). Output signals from six different phase detectors may be provided to the phase blender circuit to give fine resolution control to generate DQS' that is more closely in phase with CLK.

Figure 5:
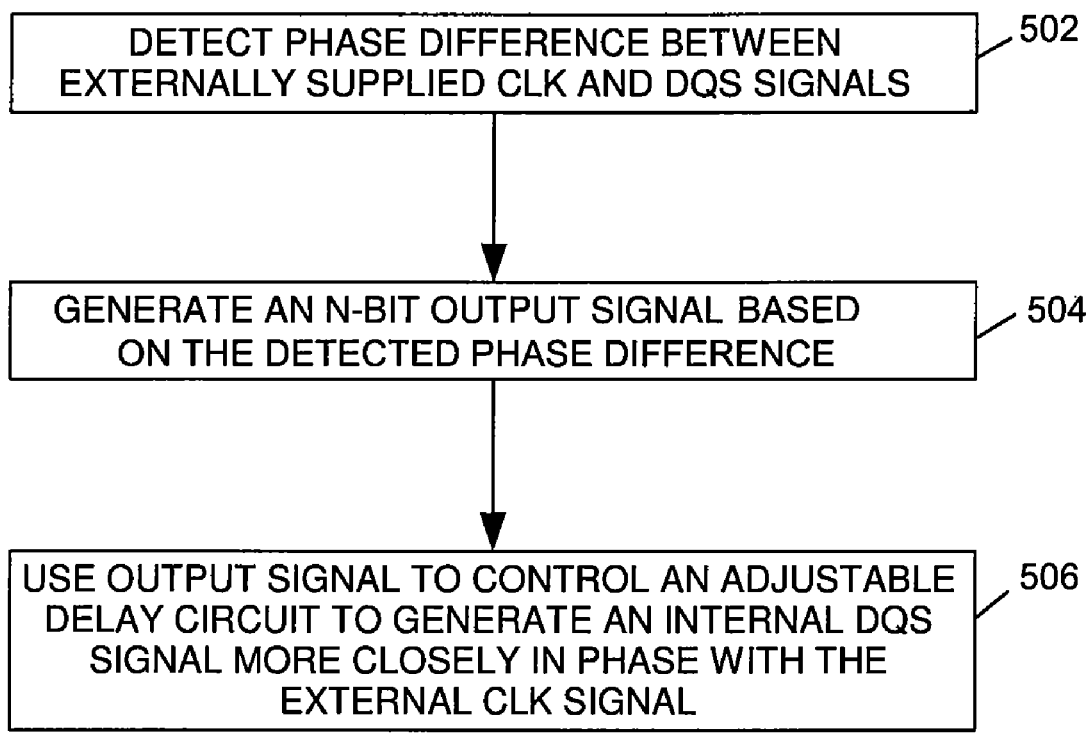
FIG. 5 is a flow chart of exemplary operations in accordance with one embodiment of the present invention.

FIG. 5 shows a flow diagram of exemplary operations that illustrates how the multi-phase detector 240 and adjustable delay circuit 250 work together to adjust internal timing of a memory device. The operations begin at step 502 by detecting (e.g., by multi-phase detector 240) a phase difference between externally supplied CLK and DQS signals. At step 504, an n-bit output signal indicative of the detected phase difference is generated. At step 506, this output signal is used to control an adjustable delay circuit to generate an internal DQS signal (DQS' ) that is more closely in phase with the external clock signal.

As previously described, the internal DQS signal may be used to control the timing of circuits involving other signals, such as data and/or address signals. As an alternative, or in addition, the timing of these other signals may also be delayed to the same effect. However, this may involve multiple delay circuits, considering the multiple other signals, and may require more complicated circuitry than delaying a single DQS signal.

While the foregoing is directed to embodiments of the present invention, other and further embodiments of the invention may be devised without departing from the basic scope thereof, and the scope thereof is determined by the claims that follow.

What is claimed is:

1. A method for adjusting the timing of an internal signal within an integrated circuit, comprising:
   determining a phase difference between first and second externally supplied timing signals;
   generating a multi-bit control signal based upon the determined phase difference; and
   adjusting the timing of the internal signal based upon the multi-bit control signal, wherein the internal signal is a delayed version of the second externally supplied timing signal, and wherein adjusting the timing of the internal signal comprises blending one or more delayed versions of the second externally supplied timing signal based on the multi-bit control signal.

2. The method of claim 1, wherein the internal signal is an input to control logic whose timing is controlled by the second externally supplied timing signal.

3. The method of claim 1, wherein generating the multi-bit control signal based upon the determined phase difference comprises concatenating output signals from multiple phase detector circuits, each receiving the first and second externally supplied timing signals as inputs.

4. A method for adjusting the timing of one or more signals used by a memory device, comprising:
   determining a phase difference between an externally supplied clock signal (CLK) and an externally supplied data strobe signal (DQS);
   generating a multi-bit control signal based upon the determined phase difference; and
   adjusting the timing of the one or more signals based upon the multi-bit control signal, wherein the one or more signals comprise at least one delayed version of the DQS signal, and wherein adjusting the timing of the one or more signals comprises blending one or more delayed versions of the DQS signal based on the multi-bit control signal.

5. The method of claim 4, wherein the one or more signals are an input to control logic whose timing is controlled by the DQS signal.

6. The method of claim 4, further comprising supplying the multi-bit control signal to a memory controller for use in adjusting at least one of the CLK and DQS signals.

7. An apparatus for adjusting internal timing of an integrated circuit based on first and second externally supplied timing signals, comprising:
   at least one phase detection circuit configured to detect a difference in phase between the first and second externally supplied timing signals and generate at least one delay control signal indicative of the detected phase difference; and
   an adjustable delay circuit configured to adjust the timing of an internal timing signal based on the delay control signal, wherein the adjustable delay circuit comprises:
      a plurality of delay elements; and
      a blender circuit to generate the internal timing signal by blending one or more output signals from the plurality of delay elements, wherein the output signals blended are determined by the delay control signal.

8. The apparatus of claim 7, wherein said at least one phase detection circuit comprises a plurality of discrete phase detectors.

9. The apparatus of claim 7, wherein the internal timing signal is a delayed version of the second externally supplied timing signal.

10. The apparatus of claim 7, wherein the internal timing signal is an input to a logic circuit controlled by the second externally supplied timing signal.

11. A memory device, comprising:
   one or more memory elements;
   at least one phase detection circuit configured to detect a difference in phase between a clock signal (CLK) and a data strobe signal (DQS) used during write accesses to the one or more memory elements and to generate a multi-bit control signal indicating the detected phase difference, wherein the at least one phase detection circuit comprises a plurality of individual phase detectors each receiving the CLK and DQS signals as inputs.

12. The memory device of claim 11, further comprising:
   one or more pins for supplying the multi-bit control signal to an external device.

13. A memory device, comprising:
   one or more memory elements;
   at least one phase detection circuit configured to detect a difference in phase between a clock signal (CLK) and a data strobe signal (DQS) used during write accesses to the one or more memory elements and to generate a multi-bit control signal indicating the detected phase difference; and at least one adjustable delay circuit configured to adjust the timing of at least one internal timing signals based on the multi-bit control signal, wherein the adjustable delay circuit comprises:
a plurality of delay elements; and
a blender circuit to generate the internal timing signal by blending one or more output signals from the plurality of delay elements, wherein the output signals blended are determined by the delay control signal.

14. The memory device of claim 13, wherein the adjustable delay circuit is configured to generate the internal timing signal by delaying the DQS signal based on the multi-bit control signal.

* * * * *